US007851865B2

(12) United States Patent
Anderson et al.

(10) Patent No.: US 7,851,865 B2
(45) Date of Patent: Dec. 14, 2010

(54) FIN-TYPE FIELD EFFECT TRANSISTOR STRUCTURE WITH MERGED SOURCE/DRAIN SILICIDE AND METHOD OF FORMING THE STRUCTURE

(75) Inventors: Brent A. Anderson, Jericho, VT (US); Andres Bryant, Burlington, VT (US); John J. Ellis-Monaghan, Grand Isle, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 535 days.

(21) Appl. No.: 11/873,521

(22) Filed: Oct. 17, 2007

(65) Prior Publication Data
US 2009/0101978 A1    Apr. 23, 2009

(51) Int. Cl.
*H01L 29/78* (2006.01)
(52) U.S. Cl. .................... 257/365; 257/E29.264
(58) Field of Classification Search .................. 257/365
See application file for complete search history.

(56) References Cited

U.S. PATENT DOCUMENTS

| | | | |
|---|---|---|---|
| 6,716,731 B2 | 4/2004 | Fujisawa | |
| 7,074,662 B2 | 7/2006 | Lee et al. | |
| 7,115,947 B2 | 10/2006 | Clark, Jr. et al. | |
| 7,214,991 B2 | 5/2007 | Yeo et al. | |
| 7,309,626 B2 | 12/2007 | Ieong et al. | |
| 7,309,634 B2 | 12/2007 | Hong | |
| 7,378,710 B2 | 5/2008 | Breitwisch et al. | |
| 7,381,655 B2 | 6/2008 | Furukawa et al. | |
| 2006/0001109 A1* | 1/2006 | Shaheen et al. | 257/401 |
| 2006/0043616 A1 | 3/2006 | Anderson et al. | |
| 2006/0134868 A1* | 6/2006 | Yoon et al. | 438/283 |
| 2006/0220120 A1* | 10/2006 | Horch | 257/341 |
| 2006/0220134 A1 | 10/2006 | Huo et al. | |
| 2006/0261411 A1 | 11/2006 | Hareland et al. | |
| 2007/0034972 A1 | 2/2007 | Chau et al. | |
| 2007/0117311 A1 | 5/2007 | Zaman | |

(Continued)

OTHER PUBLICATIONS

Anderson et al., U.S. Appl. No. 11/778,217, Office Action Communication, Dec. 29, 2008, 7 pages.

(Continued)

*Primary Examiner*—Zandra Smith
*Assistant Examiner*—Lawrence Tynes, Jr.
(74) *Attorney, Agent, or Firm*—Gibb I.P. Law Firm, LLC

(57) ABSTRACT

Disclosed herein are embodiments of a design structure of a multiple fin fin-type field effect transistor (i.e., a multiple fin dual-gate or tri-gate field effect transistor) in which the multiple fins are partially or completely merged by a highly conductive material (e.g., a metal silicide). Merging the fins in this manner allow series resistance to be minimized with little, if any, increase in the parasitic capacitance between the gate and source/drain regions. Merging the semiconductor fins in this manner also allows each of the source/drain regions to be contacted by a single contact via as well as more flexible placement of that contact via.

20 Claims, 8 Drawing Sheets

U.S. PATENT DOCUMENTS

| | | |
|---|---|---|
| 2007/0181959 A1 | 8/2007 | Park et al. |
| 2007/0190708 A1 | 8/2007 | Kaneko et al. |
| 2008/0067613 A1 | 3/2008 | Anderson et al. |
| 2008/0128796 A1 | 6/2008 | Zhu et al. |
| 2008/0188080 A1 | 8/2008 | Furukawa et al. |
| 2008/0230852 A1 | 9/2008 | Yu et al. |
| 2008/0296648 A1 | 12/2008 | Zhu |
| 2008/0296702 A1 | 12/2008 | Lee et al. |
| 2008/0303593 A1 | 12/2008 | Knoblinger |

OTHER PUBLICATIONS

PCT International Search Report for International Application No. PCT/US2008/070143, International Searching Authority Communication, Jan. 23, 2009.

USPTO Office Communication dated Nov. 18, 2009, U.S. Appl. No. 11/778,217, pp. 9.

Anderson, et al., U.S. Appl. No. 11/778,217, Office Action Communication, May 22, 2009, 12 pages.

* cited by examiner

FIN-TYPE FIELD EFFECT TRANSISTOR STRUCTURE WITH MERGED SOURCE/DRAIN SILICIDE AND METHOD OF FORMING THE STRUCTURE

CROSS-REFERENCE TO RELATED APPLICATIONS

This application is related to application Ser. No. 11/778,217 filed Jul. 16, 2007, the complete disclosure of which, in its entirety, is herein incorporated by reference.

BACKGROUND

1. Field of the Invention

The embodiments of the invention generally relate to fin-type field effect transistors and, more particularly, to a fin-type field effect transistor having multiple fins which are merged by a conductor (e.g., a metal silicide).

2. Description of the Related Art

As transistor design is improved and evolves, the number of different types of transistors continues to increase. Multi-gated non-planar metal oxide semiconductor field effect transistors, including dual-gate fin-type FETs and tri-gate fin-type FETs, were developed to provide scaled devices with faster drive currents and reduced short channel effects over planar FETs.

A dual-gate fin-type FET is a FET in which the channel region is formed in the center of a thin semiconductor fin. The source/drain regions are formed in the opposing ends of the fin on either side of the channel region. Gates are generally formed on each side of the thin semiconductor fin in an area corresponding to the channel region. A "finFET" generally refers to a dual-gate fin-type FET in which the fin is so thin as to be fully depleted. The effective fin width is determined by the fin height (e.g., short wide fins can cause partial depletion of a channel). For a finFET, a fin thickness of approximately one-fourth the length of the gate (or less) can ensure suppression of deleterious short-channel effects, such as variability in threshold voltage and excessive drain leakage currents. FinFETs are discussed in U.S. Pat. No. 6,413,802 to Hu et al., which is incorporated herein by reference.

A tri-gate fin-type FET has a similar structure to that of a dual-gate fin-type FET; however, the fin width and height are approximately the same so that gates can be formed on three sides of the channel region, including the top surface and the opposing sidewalls. The height to width ratio is generally in the range of 3:2 to 2:3 so that the channel region will remain fully depleted and the three-dimensional field effects of a tri-gate FET will give greater drive current and improved short-channel characteristics over a planar transistor.

The effective channel width of both dual-gate and tri-gate fin-type FETs can further be increased by incorporating multiple fins into the FET structure. However, as the size of such FET structures is scaled, drive current becomes limited by series resistance.

SUMMARY

In view of the foregoing, disclosed herein are embodiments of a multiple fin fin-type field effect transistor (i.e., a multiple fin dual-gate or tri-gate field effect transistor) in which the multiple fins are partially or completely merged by a highly conductive material (e.g., a metal silicide). Merging the fins in this manner allow series resistance to be minimized with little, if any, increase in the parasitic capacitance between the gate electrode and source/drain regions. Merging the semiconductor fins in this manner also allows merged source/drain regions to be contacted by a single contact via as well as more flexible placement of that contact via.

More particularly, disclosed herein are embodiments of a multiple fin fin-type field effect transistor (FET), such as a multi-fin dual-gate FET or a multi-fin tri-gate FET.

The FET can comprise a plurality of semiconductor fins (e.g., at least two semiconductor fins) on a substrate and, more particularly, on an isolation layer of a substrate. The semiconductor fins can each have a top surface, opposing sidewalls, opposing end regions (i.e., source/drain regions) and a center region (i.e., a channel region) between the opposing end regions. The semiconductor fins can further be oriented approximately parallel to one another and can be separated by a space. Additionally, the end regions of each fin can have an epitaxial silicon layer on the top surface and the sidewalls. However, the thickness of this epitaxial silicon layer is such that the fins are not merged.

Depending upon whether the FET is a dual-gate FET or a tri-gate FET, the height to width ratio of the fins in the center region (i.e., in the channel region) may vary. For example, for a dual-gate FET, the height to width ratio of the channel region of each fin can be approximately 4:1 or greater, whereas for a tri-gate FET, the height to width ratio of the channel region of each fin can range between approximately 3:2 and 2:3.

A gate electrode can be positioned adjacent to the center region (i.e., adjacent to the channel region) of each semiconductor fin between the opposing ends (i.e., between the source/drain regions). Again, depending upon whether the FET is a dual-gate FET or a tri-gate FET, the position of the gate electrode relative to the fins may vary. For example, for a dual-gate FET, the gate electrode can be positioned adjacent to the sidewalls of the channel region of each fin, but can be electrically isolated from the top surface of the channel region of each fin (e.g., by a fin cap). For a tri-gate FET, the gate electrode can be positioned adjacent to the top surface and the sidewalls of the channel region of each fin.

A conductor can traverse and merge the semiconductor fins on one end (i.e., can traverse and merge the source/drain region of each fin on one side of the gate electrode). The conductor can comprise a highly conductive material (e.g., a metal silicide) on the top surface of each fin and in the space between adjacent fins. The conductive material within the space can extend the width of the space between the sidewall of one fin to the sidewall of its adjacent fin in order to merge the fins. It should be understood that if the fins have an epitaxial silicon layer on the top surface and sidewalls, then the conductive material is formed on the epitaxial silicon layer on the top surface of the fins and extends in the space remaining between the epitaxial silicon layers on the sidewalls of adjacent fins.

The space between adjacent fins can be either completely filled with the conductive material (i.e., the conductive material extends between the sidewalls of adjacent fins and from the top surface down to the substrate) to minimize series resistance or partially filled with the conductive material (i.e., the conductive material extends between the sidewalls of adjacent fins, but does not extend the full length of the fins from the top surface to the substrate) to selectively tailor series resistance.

The FET may also comprise a similarly configured conductor (i.e., a second conductor) that traverses and merges the source/drain regions of the fins on the opposite side of the gate electrode. However, it may be advisable to tailor series resistance and, particularly, to tailor resistance on one side of the gate electrode as compared to the other. Thus, it is anticipated that the FET structure on may not be symmetric.

Dielectric spacer(s) adjacent to the semiconductor fins can electrically isolate the conductor(s) from the gate electrode.

Also disclosed are embodiments of a method of forming the above-described multi-fin dual-gate or tri-gate field effect transistor. The method embodiments comprise providing a substrate and forming a plurality of semiconductor fins (e.g., silicon fins) on substrate. The fins can be formed such that they are approximately parallel to each other, are adjacent to each other and are separated from each other by a space. They can further be formed such that each fin has a top surface, opposing sidewalls, opposing ends and a center region between the opposing ends. For a dual-gate FET, the height to width ratio of the channel region of each of the semiconductor fins can be approximately 4:1 or greater, whereas for a tri-gate FET, the height to width ratio of the channel region of each of the semiconductor fins can range between approximately 3:2 and 2:3.

A gate electrode can be formed adjacent to the center region of each of the fins. For a dual-gate FET, the gate electrode can be formed adjacent to the sidewalls of the center region of each fin and can be electrically isolated from the top surface of the center region of each fin (e.g., by a cap layer). For a tri-gate FET, the gate electrode can be formed adjacent to the top surface and the sidewalls of the center region of each of the semiconductor fins.

Dielectric spacers can be formed adjacent to the gate electrode so as to electrically isolate subsequently formed conductor(s) from the gate electrode. An epitaxial silicon layer can then be formed on the top surface and the sidewalls of the end regions of each fin without merging the fins. Thus, even after formation of the epitaxial silicon layer, a portion of the space between adjacent fins remains. Next, an implantation process can be performed in order to form source/drain regions in the opposing end regions of the fins.

Following source/drain formation, a conductor (i.e., a first conductor) can be formed traversing an end region (i.e., a first end region) of each semiconductor fin so as to merge the source/drain regions of each fin on one side of the gate electrode. This conductor can be formed by forming a highly conductive material on the top surface and sidewalls of the first end region of each fin so that the conductive material is in the space and extends the width of the space between adjacent semiconductor fins and so that it extends between the sidewalls of those adjacent semiconductor fins. During the conductor formation process, the space between adjacent fins can be either completely filled with the conductive material (i.e., the conductive material extends the width of the space between the sidewalls of adjacent fins and the entire length of the space from the top surface of the fins down to the substrate) so as to minimize series resistance or partially filled with the conductive material (i.e., the conductive material extends the width of the space between the sidewalls of adjacent fins, but does not extend the full length of space to the substrate) so as to tailor series resistance.

An exemplary technique that may be used to form the conductor comprises performing a self-aligned silicide formation process (i.e., a silicidation process) so as to form metal silicide layers on the top surface and the sidewalls of the end region of each of the semiconductor fins. The self-aligned silicide formation process is continued until the metal silicide layers on the sidewalls of the adjacent semiconductor films merge.

Another similarly configured conductor (i.e., a second conductor) that traverses and merges the opposite end of each of the semiconductor fins can also be formed. The first and second conductors may be formed so that the FET structure is symmetric with series resistance on either side of the gate electrode being approximately equal. However, transistor designers may also find it necessary to selectively vary the series resistance in the source (i.e., on one side of the gate electrode) as compared to that in the drain (i.e., on the opposite side of the gate electrode). Thus, it is anticipated that the method embodiments may not result in a symmetric FET structure.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
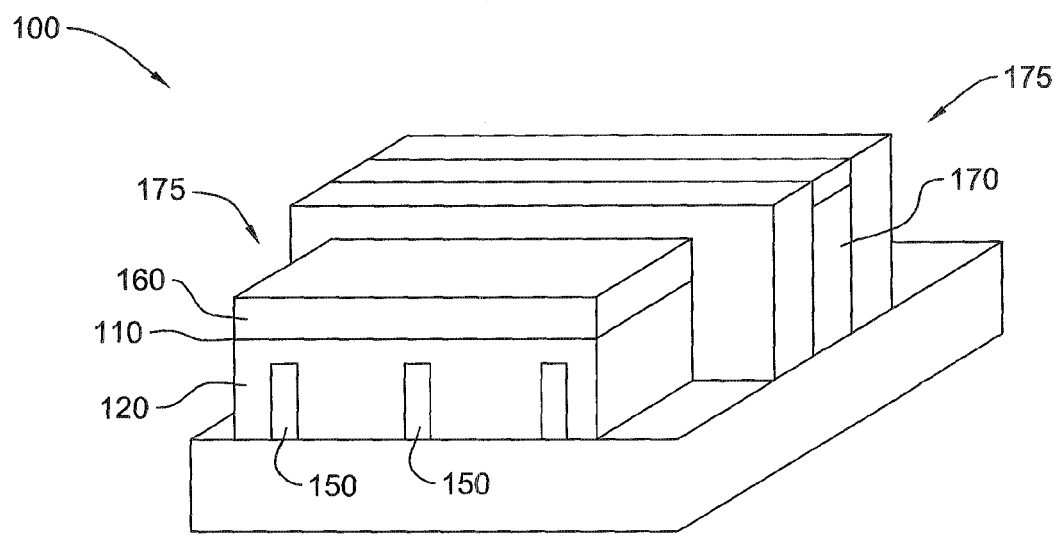
FIG. 1 is a schematic diagram illustrating a multi-fin field effect transistor.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, the effective channel width of both dual-gate and tri-gate fin-type field effect transistors can be increased by incorporating multiple fins into the FET structure. However, as the size of such FET structures is scaled, drive current becomes limited by series resistance. A significant component of series resistance is due to silicide-silicon contact resistance. The impact of the silicide-silicon contact resistance can be reduced by maximizing the silicide-silicon interface area in the source/drain regions of the fins.

Referring to FIG. 1, one technique for reducing the series resistance in a multi-fin FET 100 by increasing the silicide-silicon interface area 110 comprises epitaxially growing silicon 120 on the fins 150 until they are merged together (i.e., connected electrically by the epitaxially grown silicon 120) and then siliciding the top surface (see silicide 160). An advantage of this technique is that due to the merger of the fins and the silicide 160 only one contact via is required for each of the source/drain regions 175 on either side of the gate electrode 170. Additionally, placement of that contact via is flexible. However, this technique has several disadvantages. First, series resistance still remains relatively high due to the limited silicide-silicon interface area 110 as well as due to the relatively long distance between the silicide 160 and the channel region (i.e., in the center region of the fins adjacent to the gate electrode 170). Furthermore, this technique results in relatively high parasitic capacitance between the gate electrode 170 and the silicon 120 in the source/drain regions 175.

Figure 2:
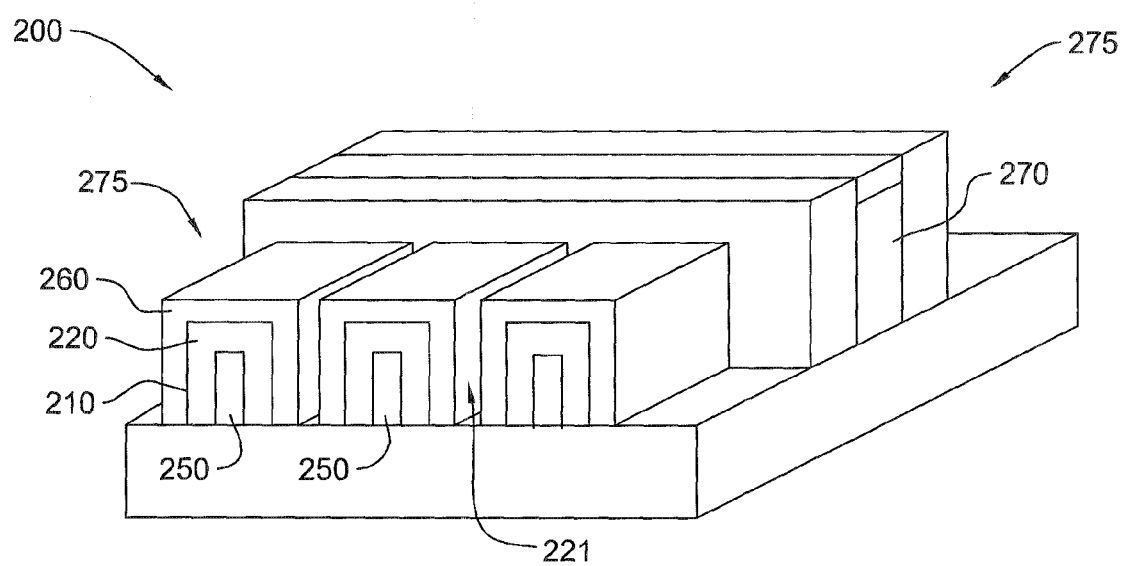
FIG. 2 is a schematic diagram illustrating another multi-fin field effect transistor.

Referring to FIG. 2, another technique for reducing the series resistance in a multi-fin FET 200 by increasing the silicide-silicon interface area 210 also epitaxially grows silicon 220 on the fins 250. This technique does not, however, merge the fins 250 but rather increases the width and height of the fins 250 with the epitaxially grown silicon 220. The silicide 260 is formed on the top surface and sidewalls of the epitaxial silicon 220 surface of the fins 250, leaving a space 221 between each of the individually silicided fins. Advantages of this technique over the previously described technique include the fact that it results in an increase in the silicide-silicon interface area 210, a reduction in the distance between the silicide 260 and the channel region, and a reduction in the amount of parasitic capacitance between the gate electrode 270 and the source/drain regions 275. However, this technique does not allow for a single contact via on either side of the gate electrode 270. That is, each fin 250 must be individually contacted.

In view of the foregoing, disclosed herein are embodiments of a multiple fin fin-type field effect transistor (i.e., a multiple fin dual-gate or tri-gate field effect transistor) in which the multiple fins are merged by a highly conductive material (e.g., a metal silicide). Merging the fins in this manner allow series resistance to be minimized with little, if any, increase in the parasitic capacitance between the gate and source/drain regions. Merging the semiconductor fins in this manner also allows each of the source/drain regions to be contacted by a single contact via as well as more flexible placement of that contact via.

Figure 3:
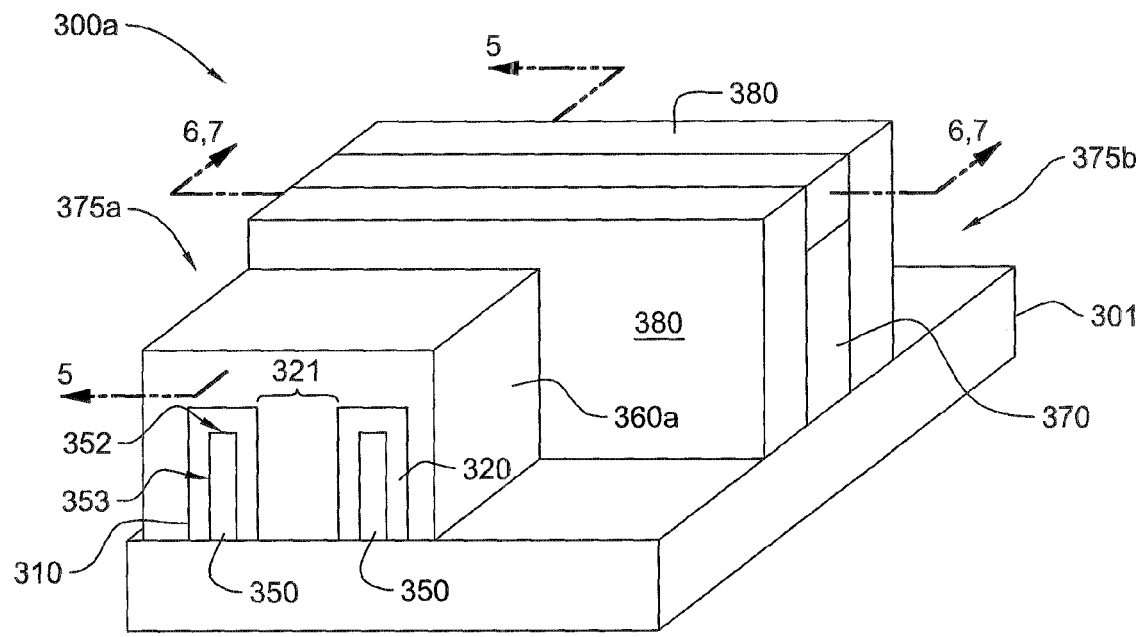
FIG. 3 is a schematic diagram illustrating an embodiment of the multi-fin field effect transistor of the present invention.
Figure 4:
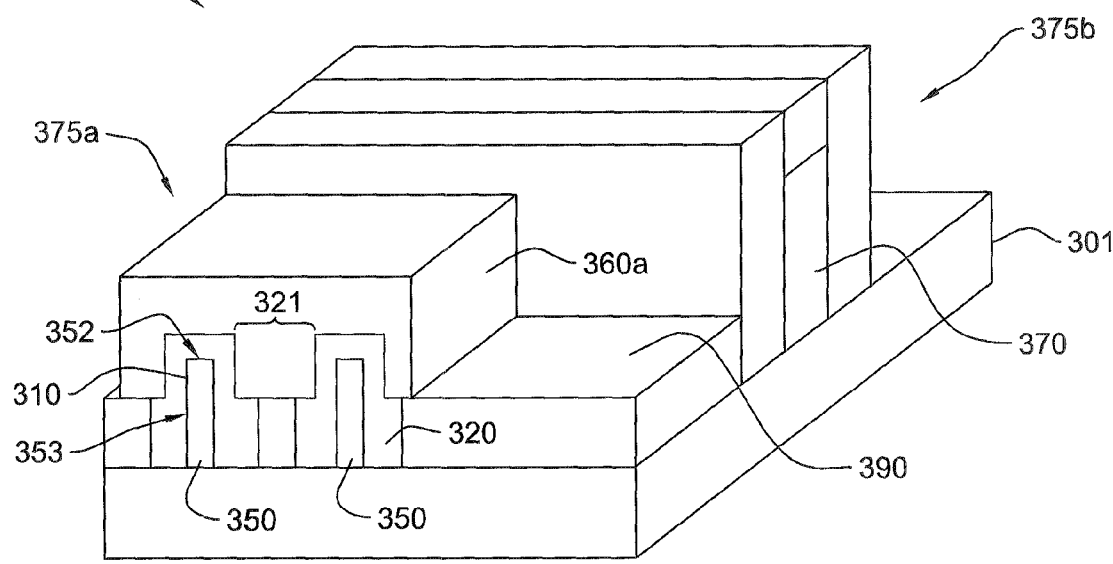
FIG. 4 is a schematic diagram illustrating another embodiment of the multi-fin field effect transistor of the present invention.
Figure 5:
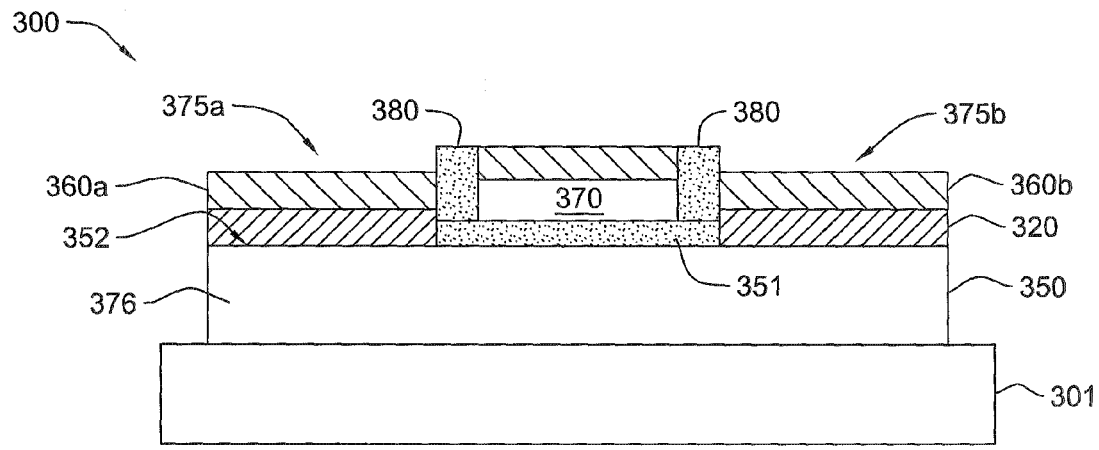
FIG. 5 is a schematic diagram illustrating an exemplary cross-section of an embodiment of the field effect transistor of the present invention.

More particularly, referring to FIGS. 3-5 in combination, disclosed herein are embodiments of a multiple fin fin-type field effect transistor (FET) 300. For example, see FET embodiment 300a of FIG. 3, FET embodiment 300b of FIG. 4, and cross-section of FET 300 in FIG. 5.

The FET 300 can comprise a plurality of semiconductor fins 350 (e.g., at least two semiconductor fins) on a substrate 301 and, more particularly, on an isolation layer of a substrate 301. For example, the semiconductor fins 350 can be formed as silicon fins on an isolation layer, such as a buried oxide layer, of a silicon-on-insulator (SOI) wafer. The semiconductor fins 350 can each have a rectangular shape with a bottom surface that is adjacent to the substrate 301 (i.e., adjacent to the insulator layer of the substrate), a top surface 352, opposing sidewalls 353, opposing end regions (i.e., doped source/drain regions 375a-b) and a center region (i.e., a channel region 376, see cross-section of FIG. 5) between the opposing end regions 375a-b. The semiconductor fins 350 can further be oriented approximately parallel to one another and can be separated by a space 321.

Depending upon whether the FET 300 is a dual-gate FET or a tri-gate FET, the height to width ratio of the fins in the center region (i.e., in the channel region) may vary. For example, for a dual-gate FET, the height to width ratio of the channel region 376 of each fin may be approximately 4:1 or greater (see FIG. 6). Alternatively, for a tri-gate FET, the height to width ratio of the channel region 376 of each fin can range between approximately 3:2 and 2:3 (see FIG. 7).

Additionally, as mentioned above, the basic fin structure 350 can comprise a silicon fin. However, the FET structure 300 can further comprise an epitaxial silicon layer 320 on the top surface and the sidewalls of each fin 350 in one or both of the end regions 375a-b. Thus, the overall height and/or width of the end regions (i.e., of the source/drain regions 375a-b) of each fin may be different from that of the center region 376 (i.e., different from that of the channel region).

A gate electrode 370 (i.e., a gate dielectric layer and gate conductor) can be positioned adjacent to the center region 376 (i.e., adjacent to the channel region) of each semiconductor fin 350 between the opposing ends 375 (i.e., between the source/drain regions). Again, depending upon whether the FET 300 is a dual-gate FET or a tri-gate FET, the position of the gate electrode 370 relative to each of the fins 350 may vary. Specifically, for a dual-gate FET, the gate electrode 370 can traverse each fin 350 and further can be positioned adjacent to the sidewalls 353 of the channel region 376 of each of the semiconductor fins 350, but electrically isolated from the top surface 375 (e.g., by a fin cap 351) (see cross-section of FIG. 6). Alternatively, for a tri-gate FET, the gate electrode 370 can be positioned adjacent to the top surface 352 and the sidewalls 353 of the channel region 376 of each of the semiconductor fins 350 (see cross-section of FIG. 7).

Referring again to FIGS. 3-5 in combination, a conductor 360a (i.e., a first conductor) can traverse and merge one end 375a of each of the semiconductor fins 350 (i.e., can traverse and merge the source/drain regions 375a of the fins 350 on one side of the gate electrode 370). This conductor 360a can comprise a highly conductive material that is on the top surface 352 of each of the fins 350 and further that is in the space 321 between adjacent fins 350. Specifically, the conductive material within in the space 321 between adjacent fins 350 can extend the width of the space between the sidewall 353 of one fin 350 to a sidewall 353 of its adjacent fin 350 in order to merge the fins. It is understood that if the fins 350 each comprise an epitaxial silicon layer 320 on the top surface 352 and sidewalls 352, then the conductive material will necessarily be on the epitaxial layer 320 on the top surface of each fin 350 and will further extend the width of the space between the epitaxial layers 320 on the sidewalls 353 of adjacent fins. This conductive material 360 can comprise any highly conductive material. For example, the conductive material can comprise a metal silicide, such as, a nickel silicide (NiSi), a cobalt silicide (CoSi2), a titanium silicide (TiSi2), etc.

More specifically, the space 321 between adjacent fins can be completely filled with the conductive material, as illustrated in FIG. 3. That is, the conductive material can extend the width of the space between the sidewalls of adjacent fins as well as the length of the space from the top surface of the fins down to the substrate. This configuration maximizes the silicide-silicon interface area 310 and, thereby, minimizes series resistance in the source/drain region 375a. Alternatively, the space 321 between adjacent fins can be partially filled with the conductive material, as illustrated in FIG. 4. That is, the conductive material can extend the width of the space between the sidewalls of adjacent fins and the length of the space from the top surface of the fins down some predetermined distance less than the length of the fins towards the substrate. This configuration allows the designers to selectively tailor the series resistance in the source/drain area 375a.

The FET 300 can further comprise another similarly configured conductor 360b (i.e., a second conductor) that traverses and merges the opposite end 375b of each of the semiconductor fins 350 (i.e., that traverses and merges the source/drain regions 375b of the fins 350 on the opposite side of the gate electrode 370). Thus, the FET structure can be symmetric with series resistance in the source/drain regions 375a-b on both sides of the gate electrode 370 being approximately equal.

However, it may be advisable for transistor designers to selectively vary the series resistance in the source (i.e., on one side of the gate electrode) as compared to the series resistance in the drain (i.e., on the opposite side of the gate electrode). Thus, is anticipated that the FET structure 300 on either side of the gate electrode 370 may not be symmetric.

For example, a conductor may merge the fins on only one side of the gate electrode 370. Alternatively, the space 321 between adjacent fins 350 on one side of the gate electrode 370 may be completely filled with the conductive material, whereas the space 321 on the opposite side of the gate electrode may only be partially filled with the conductive material. Those skilled in the art will recognize the above-described non-symmetric configurations are provided for illustrative purposes and that other non-symmetric configurations are anticipated.

Dielectric spacer(s) 380 adjacent to the semiconductor fins 350 and gate electrode 370 can electrically isolate the conductor(s) 360a-b from the gate electrode 370. Additionally, the merged source/drain regions 375a and/or 375b may each be contacted by a single contact via.

Figure 8:
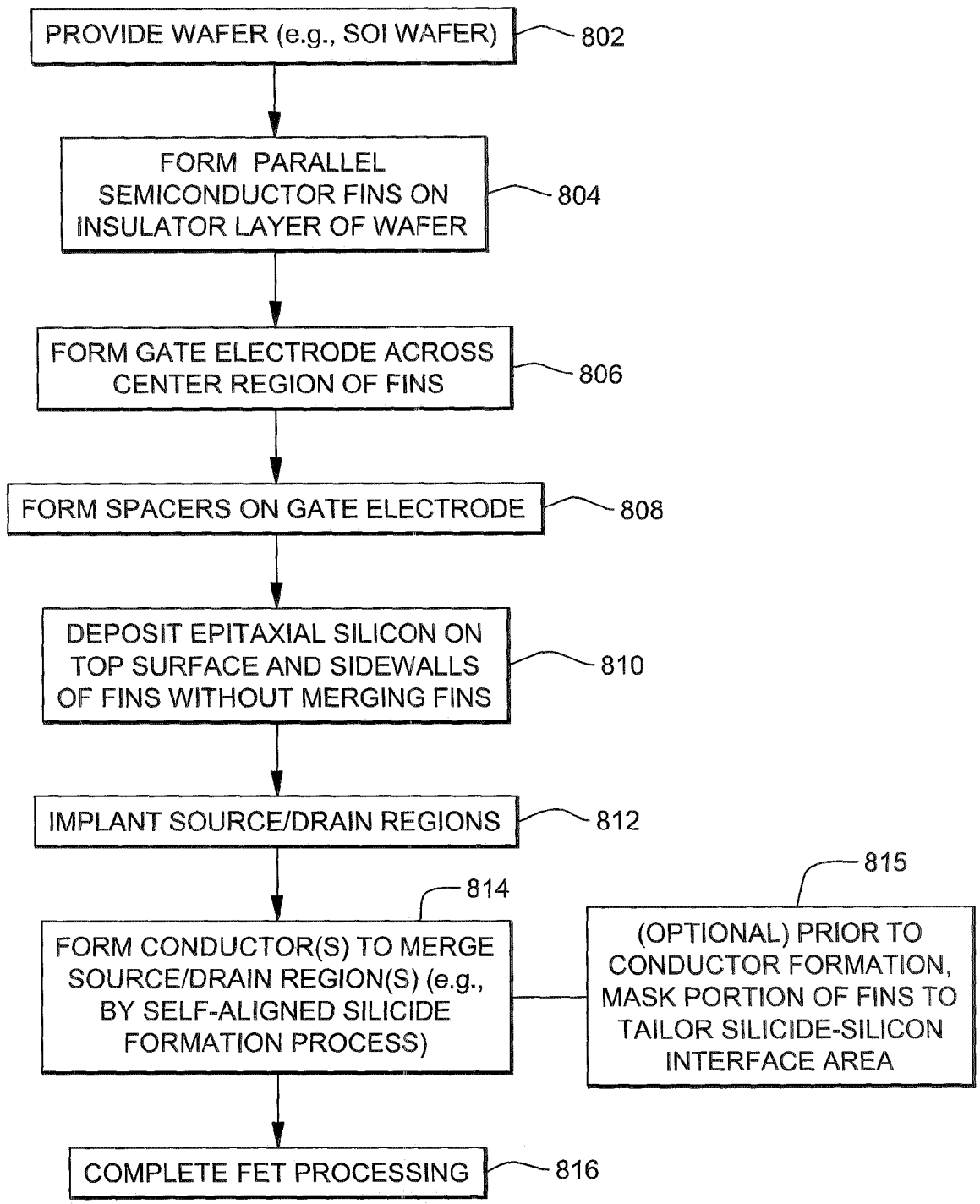
FIG. 8 is a flow diagram illustrating an embodiment of a method of forming the field effect transistors of FIGS. 3 and 4.

Referring to FIG. 8, also disclosed are embodiments of a method of forming the above-described multi-fin dual-gate or tri-gate field effect transistor 300. The method embodiments comprise providing wafer (802). This wafer can, for example, comprise a silicon-on-insulator (SOI) wafer having with a cap layer 901. Using conventional processing techniques a plurality of semiconductor fins can be formed in the silicon layer on the insulator layer (804, see FIG. 9). For example, at least two semiconductor fins 350 can be patterned and etched in the silicon layer of a silicon-on-insulator (SOI) wafer. The patterning and etch processes can be performed such that the semiconductor fins 350 are approximately parallel to each other, are adjacent to each other and are separated from each other by a space 321. The patterning and etch processes can be further be performed such that each semiconductor fin 350 has a rectangular shape with a bottom surface that is adjacent to the insulator layer 301, a top surface 352, opposing sidewalls 353, opposing ends 375a-b and a center region 376 between the opposing ends 375a-b.

Figure 6:
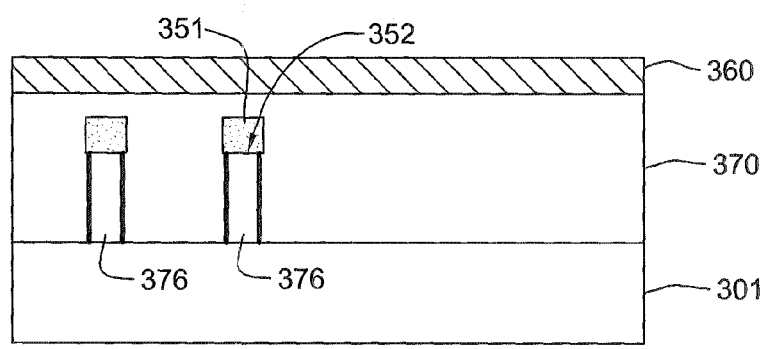
FIG. 6 is a schematic diagram illustrating an exemplary cross-section of an embodiment of the field effect transistor of the present invention.
Figure 7:
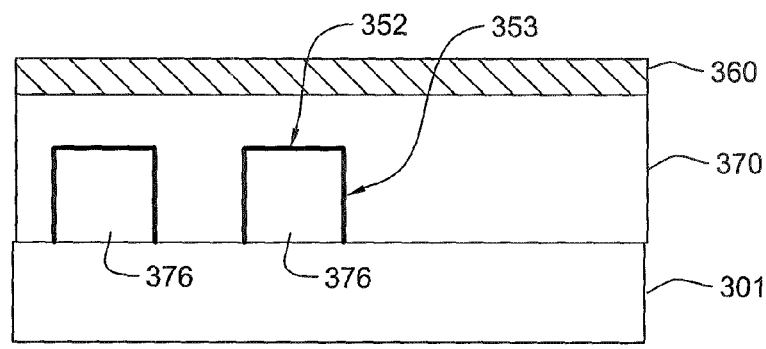
FIG. 7 is a schematic diagram illustrating another exemplary cross-section of an embodiment of the field effect transistor of the present invention.

Depending upon the type of FET being formed, the height to width ratio of the fins in the center region 376, which will correspond to the FET channel region, may be varied. For a dual-gate FET, the height to width ratio of the channel region 376 of each of the semiconductor fins can be approximately 4:1 (e.g., as illustrated in FIG. 6), whereas for a tri-gate FET the height to width ratio of the channel region 376 of each of the semiconductor fins can range between approximately 3:2 and 2:3 (e.g., as illustrated in FIG. 7).

Figure 9:
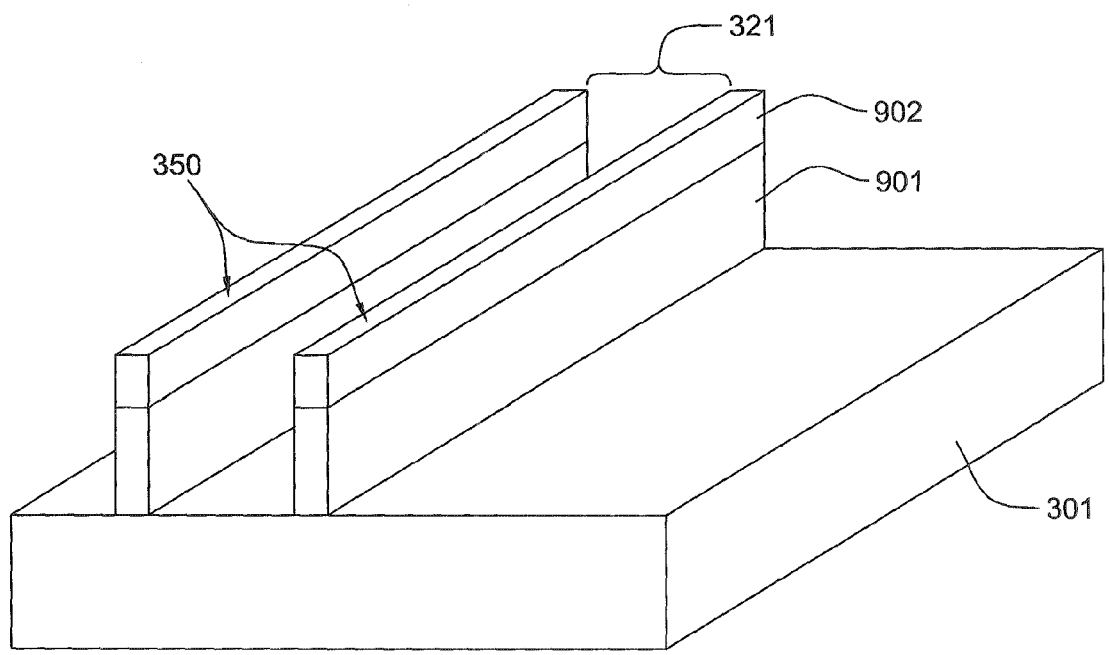
FIG. 9 is a schematic diagram illustrating a partially completed multi-fin field effect transistor.

For example, as illustrated in FIG. 9, formation of a dual-gate FET can begin at process 802 with a silicon-on-insulator wafer having a 40 nm thick silicon layer 901 and a 20 nm thick fin cap layer 902 (e.g., an oxide layer). The fins 350 can be patterned and etched through the fin cap layer 902 and silicon layer 901 so that the fins will have a thickness of approximately 15 nm and a pitch of approximately 80 nm.

After forming the semiconductor fins at process 804, if the multi-fin FET is to be a tri-gate FET, then, the oxide cap layer 902 can be selectively removed from the top surface of the fins so that the subsequently formed gate electrode 370 is not electrically isolated from top surface of the fins in the channel region (not shown).

Figure 10:
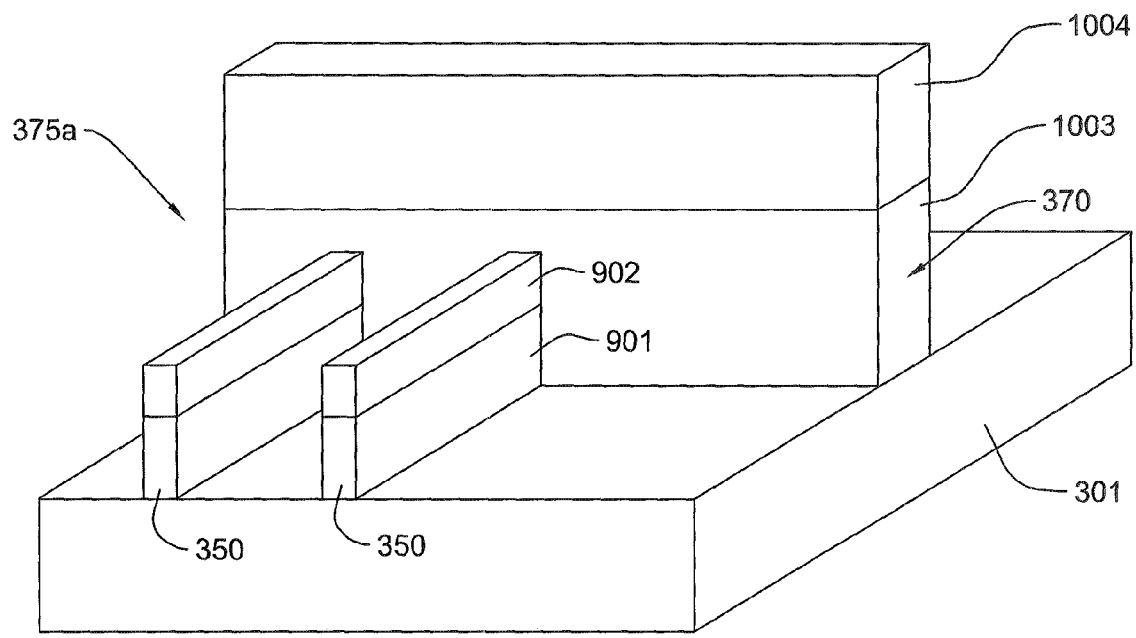
FIG. 10 is a schematic diagram illustrating a partially completed multi-fin field effect transistor.

Next, a gate electrode 370 can be formed adjacent to the center region of each of the fins (806, see FIG. 10). The gate electrode 370 can be formed using conventional processing techniques. For example, a gate stack, including a gate dielectric layer, a gate conductor layer 1003 and a gate cap layer 1004, can be deposited and patterned. Again, depending upon the type of FET being formed (i.e., a tri-gate FET or a dual-gate FET), the gate electrode 370 may or may not be electrically isolated from the top surface of the center region of each semiconductor fin. That is, for multiple-fin dual-gate transistor, the gate electrode 370 can be formed adjacent to the sidewalls 353 of the center region 376 of each of the semiconductor fins, but can be electrically isolated from the top surface 352 of the center region 376 of each of the semiconductor fins, for example, by an oxide cap 351 (e.g., as illustrated in FIG. 6). Alternatively, for a multiple-fin tri-gate transistor, the gate electrode 370 can be formed adjacent to the top surface 352 and the sidewalls 353 of the center region 376 of each of the semiconductor fins (e.g., as illustrated in FIG. 7).

For example, as illustrated in FIG. 10, at process 806 the deposited gate conductor layer 1003 can comprise a polysilicon layer 1003 having a thickness of approximately 80 nm and the deposited gate cap layer 1004 can comprise a nitride cap layer having a thickness of approximately 60 nm. The gate stack can then be patterned so that the gate length is approximately 28 nm and so that the end regions 375a-b are exposed.

Figure 11:
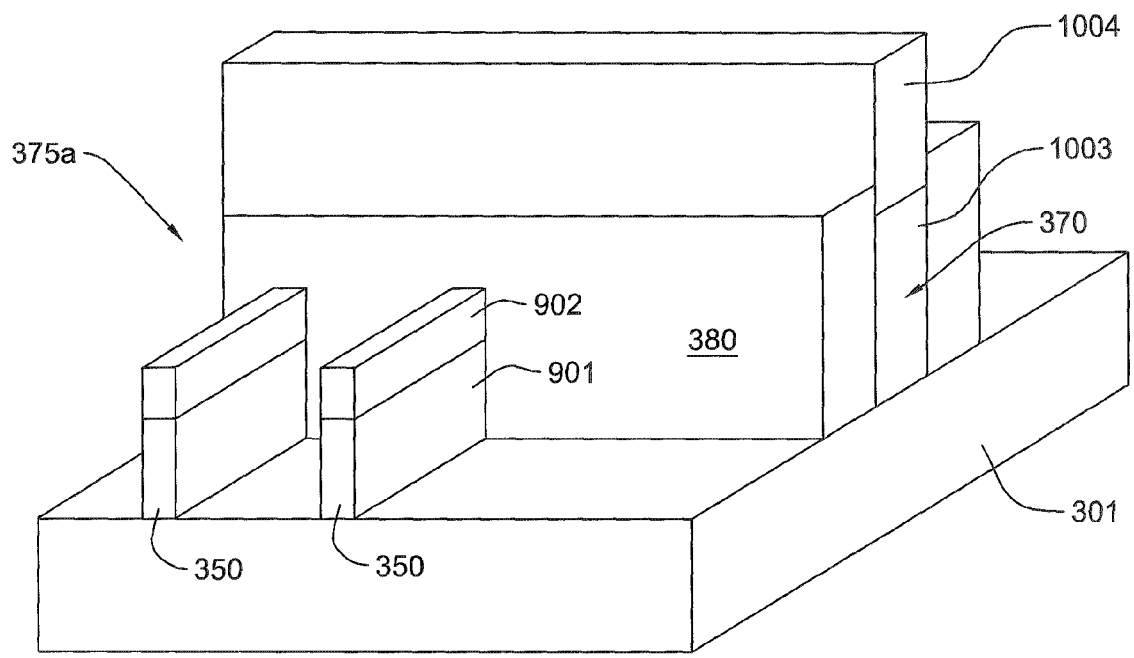
FIG. 11 is a schematic diagram illustrating a partially completed multi-fin field effect transistor.

After forming the gate electrode 370 at process 806, dielectric spacers 380 (e.g., oxide spacers) can be formed adjacent to the gate electrode 370 using conventional spacer formation techniques so as to electrically isolate subsequently formed conductors 360a-b from the gate electrode 370 (see FIG. 11). The spacers 380 can, for example, have a thickness of approximately 25 nm.

Figure 12:
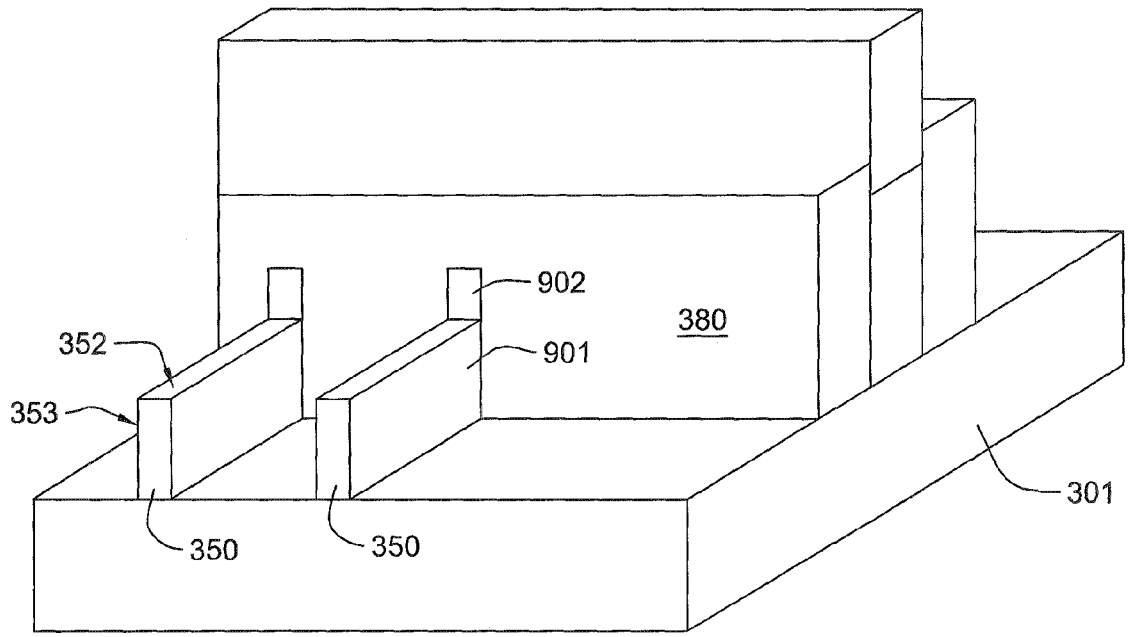
FIG. 12 is a schematic diagram illustrating a partially completed multi-fin field effect transistor.
Figure 13:
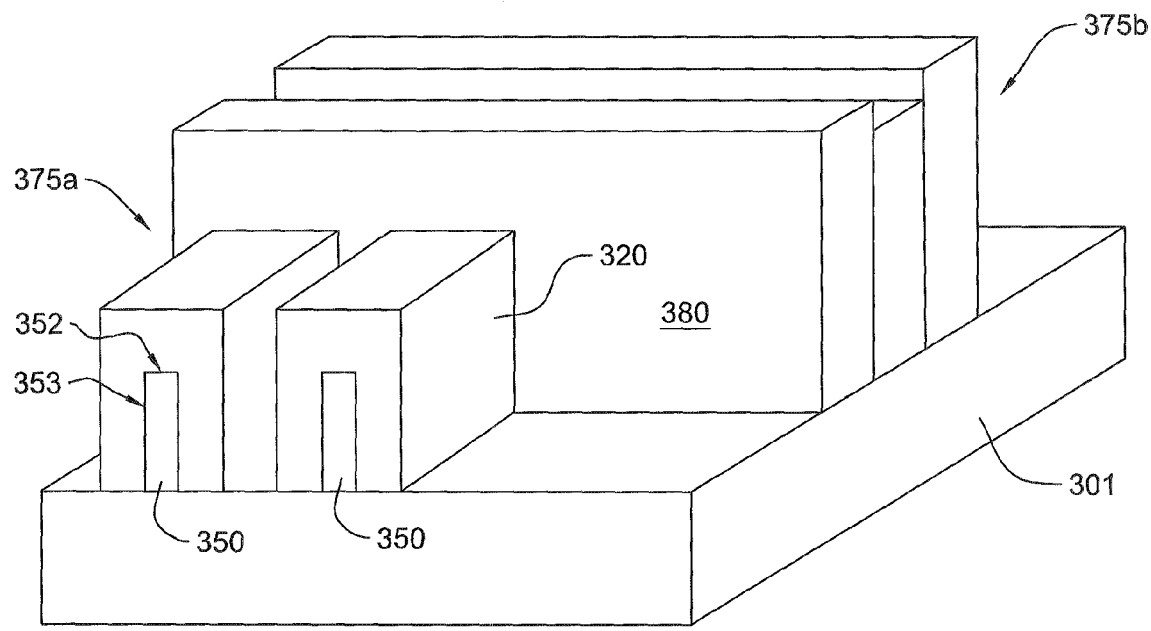
FIG. 13 is a schematic diagram illustrating a partially completed multi-fin field effect transistor.

Next, the cap layer 902 can be removed from the exposed portions of the fins, if present (see FIG. 12). Then, an epitaxial silicon layer 320 can be formed on the top surface 352 and the sidewalls 353 of the end regions 375a-b of each of the semiconductor fins 350 without merging the fins 350 (810, see FIG. 13). Thus, even after formation of the epitaxial silicon layer 320 a portion of the space 321 between adjacent fins remains. The can be accomplished using a conventional epitaxial growth process. Formation of this epitaxial silicon layer allows a subsequent self-aligned silicide process to be performed at process 812 without consuming any of the original silicon fins 350.

For example, at process 810, the epitaxial silicon layer 320 can have a thickness of approximately 20 nm on both the top surface and sidewalls of the fins 350. Thus, for a dual-gate FET, if the pitch is approximately 80 nm and the fin thickness is approximately 15 nm, then the remaining space between the epitaxial layers 320 on the sidewalls of adjacent fins 350 is approximately 25 nm.

Next source/drain regions can be formed in the opposing end regions 375a-375b of the fins 350 (812). This can be accomplished using conventional doping techniques (e.g., implantation processes) to dope the end regions of the semiconductor fins, including the epitaxial silicon layer, along with the gate polysilicon 370 with the appropriate n-type or p-type dopant. That is, for n-type FETs the source/drain regions 375a-b can be implanted with, for example, phosphorus (P), antimony (Sb) or arsenic (As). Alternatively, for p-type FETs the source/drain regions 375a-b can be implanted with, for example, boron (B).

Following source/drain formation at process 812, a conductor 360a (i.e., a first conductor) can be formed traversing an end region 375a (i.e., a first end region) of each of the semiconductor fins 350, thereby merging the source/drain regions 375a of each fin on one side of the gate electrode 370. The conductor 360a can be formed by forming a highly conductive material on the top surface and sidewalls of the end region 375a of each of fin 350 so that the conductive material is located in the space 321 between adjacent semiconductor fins 350 and so that it extends the width of the space between the sidewalls 353 of those adjacent semiconductor fins 350.

During the conductor formation process, the space 321 between adjacent fins 350 can be completely filled with the conductive material (i.e., the conductive material can be formed in the space so that it extends the width of the space from sidewall to sidewall of adjacent fins and the length of the space from the top surface of the fins down to the substrate), as illustrated in FIG. 3, so as to minimize series resistance. Alternatively, the space 321 can be partially filled with the conductive material (i.e., the conductive material can be formed so that it extends the width of the space from sidewall to sidewall of adjacent fins, but not the full length of the space from the top surface of the fins down to the substrate), as illustrated in FIG. 4, so as to tailor series resistance. It is understood that if the fins 350 are formed with an epitaxial silicon layer 320 on the top surface 352 and sidewalls 352, then the conductive material will necessarily be on the epitaxial layer 320 on the top surface of each fin 350 and will extend the width of the space between the epitaxial layers 320 on the sidewalls 353 in the space 321.

An exemplary technique that may be used to form the conductor 360a comprises performing a self-aligned silicide process (i.e., a metal silicidation process) so as to form metal silicide layers on the top surface and the sidewalls of the end region 375a of each of the semiconductor fins 350. Such a self-aligned silicide process introduces a highly conductive metal, such as nickel, cobalt or titanium, onto the exposed epitaxial silicon layer 320 on the top surface 352 and sidewalls 353 of the fins 350. This silicidation process can be formed using conventional silicidation processing techniques. That is, the selected metal (e.g., nickel, cobalt, titantium, etc.) can be deposited onto the exposed epitaxial silicon. Deposition can be followed by a thermal anneal process, thereby creating the metal-silicon compound (e.g., nickel silicide (NiSi), cobalt silicide (CoSi2), titanium silicide (TiSi2), etc.) The self-aligned silicide process is continued until the metal silicide layers 360 on the sidewalls of the adjacent semiconductor films merge (see FIG. 3).

Figure 14:
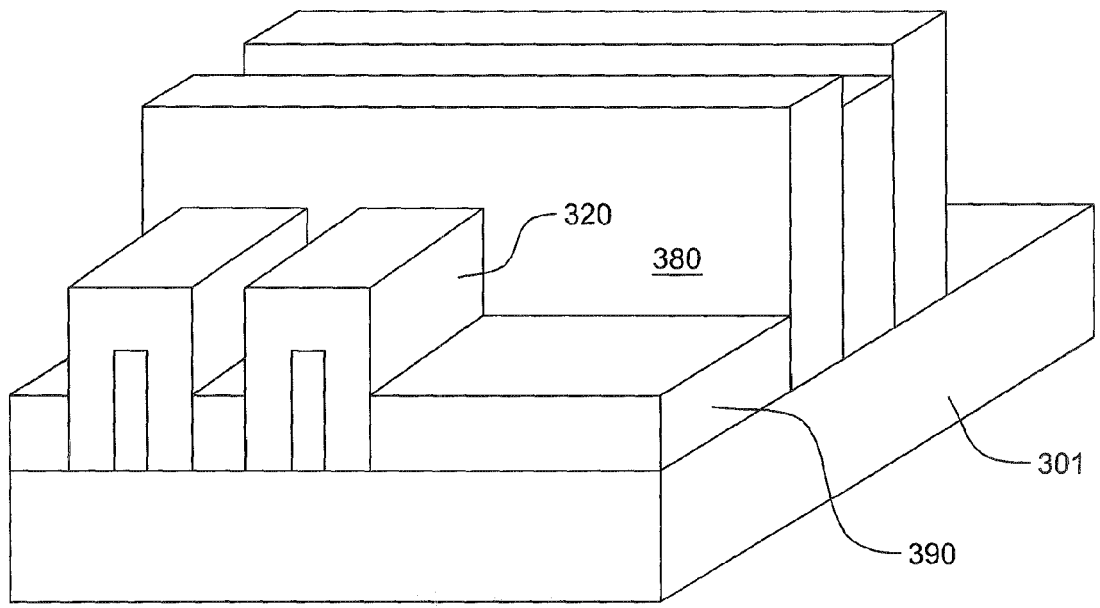
FIG. 14 is a schematic diagram illustrating a partially completed multi-fin field effect transistor.

As discussed, series resistance is a function of the silicide-silicon interface 310. That is, maximizing the silicide-silicon interface 310 minimizes series resistance. Thus, to minimize series resistance, the metal silicide 360 can be formed in the space 321 so that the space 321 is completely filled (i.e., so that the metal silicide extends the width of the space between the epitaxial silicon layers on the sidewalls of adjacent fins and the length of the space from the top surface of the fins down to the substrate), illustrated in FIG. 3. Alternatively, it may be advisable to tailor series resistance rather than minimize it. Therefore, prior to the metal silicidation process, a predetermined portion of the fins 350 can be masked so as to tailor the subsequently formed silicide-silicon interface 310 and, thereby, the series resistance (815). For example, a dielectric layer 390 (e.g., a nitride layer) can be deposited and selectively etched back so as to expose the area of the fins to be silicided (see FIG. 14). Thus, during the silicidation process, the metal silicide 360 will be formed so that it only partially fills the space 321 between adjacent fins (i.e., so that the metal silicide extends the width of the space between the epitaxial silicon layers 320 on the sidewalls 353 of adjacent fins, but only extends a portion of the length of the space from the top surface 352 of the fins 350 down to some predetermined level above the top surface of the substrate), as illustrated in FIG. 4.

In addition to forming the conductor 360a at process 814, process 814 may include forming another similarly configured conductor 360b (i.e., a second conductor) that traverses and merges the opposite end 375b of each of the semiconductor fins 350 (i.e., that traverses and merges the source/drain regions 375b of the fins 350 on the opposite side of the gate electrode 370). These conductors 360a and 360b may be symmetric such that series resistance on either side of the gate electrode is approximately equal. However, transistor designers may also find it necessary to selectively vary the series resistance in the source (i.e., on one side of the gate electrode) as compared to that in the drain (i.e., on the opposite side of the gate electrode). Thus, for example, it is anticipated that the method embodiments may not result in a symmetric FET structure.

For example, process 814 may result in silicide merged fins on only one side of the gate electrode 370. Alternatively, space 321 between adjacent fins 350 on one side of the gate electrode 370 may be completely filled with the conductive material, whereas the space 321 on the opposite side of the gate electrode may only be partially filled with the conductive material. Those skilled in the art will recognize the above-described non-symmetric configurations are provided for illustrative purposes and that other non-symmetric configurations are anticipated.

Following conductor formation at process 814, FET processing can be completed (816). For example, a blanket dielectric layer can be deposited, contacts can be formed, etc. As mentioned above, an additional advantage of merging the fins 350 in the manner described above is that only a single contact via is required for each merged source/drain region 375a and/or 375b.

Figure 15:
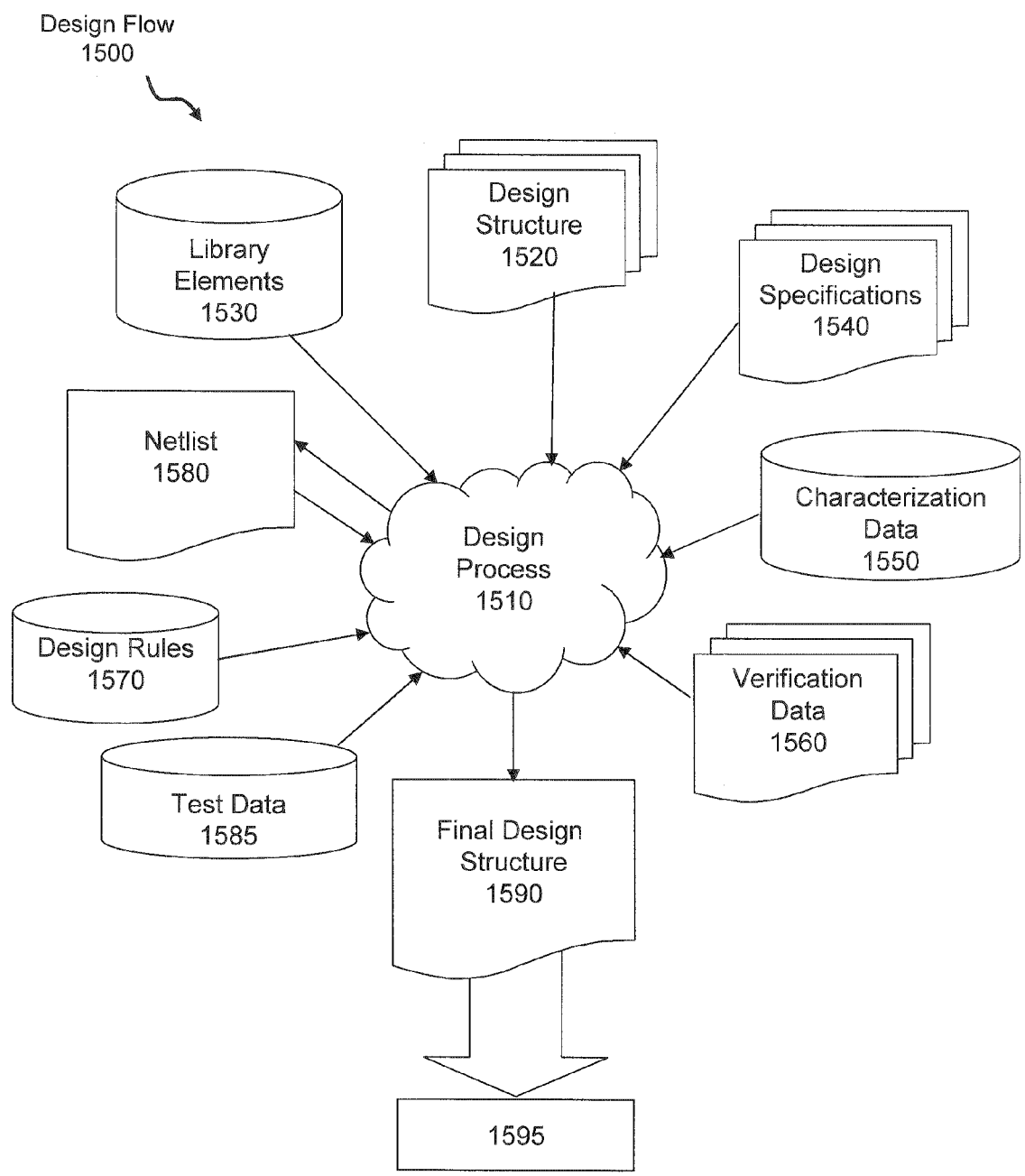
FIG. 15 is a flow diagram of a design process used in semiconductor design, manufacturing, and/or test.

FIG. 15 shows a block diagram of an example design flow 1500. Design flow 1500 may vary depending on the type of IC being designed. For example, a design flow 1500 for building an application specific IC (ASIC) may differ from a design flow 1500 for designing a standard component. Design structure 1520 is preferably an input to a design process 1510 and may come from an IP provider, a core developer, or other design company or may be generated by the operator of the design flow, or from other sources. Design structure 1520 comprise circuits in FIGS. 1-7 and FIGS. 9-14 in the form of schematics or HDL, a hardware-description language (e.g., Verilog, VHDL, C, etc.). Design structure 1520 may be contained on one or more machine readable medium. For example, design structure 1520 may be a text file or a graphical representation of circuits in FIGS. 1-7 and FIGS. 9-14. Design process 1510 preferably synthesizes (or translates) the circuits in FIGS. 1-7 and FIGS. 9-14 into a netlist 1580, where netlist 1580 is, for example, a list of wires, transistors, logic gates, control circuits, I/O, models, etc. that describes the connections to other elements and circuits in an integrated circuit design and recorded on at least one of machine readable medium. This may be an iterative process in which netlist 1580 is resynthesized one or more times depending on design specifications and parameters for the circuit.

Design process 1510 may include using a variety of inputs; for example, inputs from library elements 1530 which may house a set of commonly used elements, circuits, and devices, including models, layouts, and symbolic representations, for a given manufacturing technology (e.g., different technology nodes, 32 nm, 45 nm, 90 nm, etc.), design specifications 1540, characterization data 1550, verification data 1560, design rules 1570, and test data files 1585 (which may include test patterns and other testing information). Design process 1510 may further include, for example, standard circuit design processes such as timing analysis, verification, design rule checking, place and route operations, etc. One of ordinary skill in the art of integrated circuit design can appreciate the extent of possible electronic design automation tools and applications used in design process 1510 without deviating from the scope and spirit of the invention. The design structure of the invention is not limited to any specific design flow.

Design process 1510 preferably translates an embodiment of the invention as shown in FIG. 15, along with any additional integrated circuit design or data (if applicable), into a second design structure 1590. Design structure 1590 resides on a storage medium in a data format used for the exchange of layout data of integrated circuits (e.g. information stored in a GDSII (GDS2), GLI, OASIS, or any other suitable format for storing such design structures). Design structure 1590 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 15. Design structure 1590 may then proceed to a stage 1595 where, for example, design structure 1590: proceeds to tape-out, is released to manufacturing, is released to a mask house, is sent to another design house, is sent back to the customer, etc.

Therefore, disclosed above are embodiments of a multiple fin fin-type field effect transistor (i.e., a multiple fin dual-gate or tri-gate field effect transistor) in which the multiple fins are partially or completely merged by a highly conductive material (e.g., a metal silicide). Merging the fins in this manner allow series resistance to be minimized with little, if any, increase in the parasitic capacitance between the gate and source/drain regions. Merging the semiconductor fins in this manner also allows each of the source/drain regions to be contacted by a single contact via as well as more flexible placement of that contact via.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A design structure embodied in a machine readable medium used in a design process, the design structure comprising a field effect transistor comprising:
   a substrate;
   a plurality of semiconductor fins on said substrate, each of said semiconductor fins having a top surface, sidewalls, a first end region, a second end region and a center region positioned laterally between said first end region and said second end region, said first end region and said second end region comprising source/drain regions and said center region comprising a channel region;
   a gate electrode on said top surface and said sidewalls of each of said semiconductor fins at said center region;
   gate sidewall spacers on said top surface and said sidewalls of each of said semiconductor fins immediately adjacent to opposite sides of said gate electrode; and
   a conductor, comprising a metal silicide material on said top surface and said sidewalls of each of said semiconductor fins at only said first end region immediately adjacent to one of said gate sidewall spacers such that said metal silicide material fills at least an upper portion of a space extending between adjacent first end regions of adjacent semiconductor fins so as to electrically connect said first end regions, said one of said gate sidewall spacers electrically isolating said conductor from said gate electrode.

2. The design structure according to claim 1, said metal silicide material comprising any one of nickel silicide, cobalt silicide and titanium silicide.

3. The design structure according to claim 1, further comprising an epitaxial silicon layer on said top surface and said opposing sidewalls of each of said semiconductor fins at said first end region such that said epitaxial silicon layer is positioned between said semiconductor fins and said conductive material.

4. The design structure according to claim 1, said design structure comprising a netlist which describes a circuit.

5. The design structure according to claim 1, said design structure residing on a storage medium as a data format used for the exchange of layout data of integrated circuits.

6. The design structure according to claim 1, said design structure including at least one of test data files, characterization data, verification data, and design specifications.

7. A design structure embodied in a machine readable medium used in a design process, the design structure comprising a field effect transistor comprising:
   a substrate;
   a plurality of semiconductor fins on said substrate, each of said semiconductor fins having a top surface, sidewalls, a first end region, a second end region and a center region positioned laterally between said first end region and said second end region, said first end region and said second end region comprising source/drain regions and said center region comprising a channel region;

a gate electrode on said top surface and said sidewalls of each of said semiconductor fins at said center region;

gate sidewall spacers on said top surface and said sidewalls of each of said semiconductor fins immediately adjacent to opposite sides said gate electrode; and a conductor comprising a conductive material covering said top surface and said sidewalls of each of said semiconductor fins at only said first end region immediately adjacent to one of said gate sidewall spacers such that said conductive material completely fills a space extending between adjacent first end regions of adjacent semiconductor fins so as to electrically connect said adjacent first end regions, said one of said gate sidewall spacers electrically isolating said conductor from said gate electrode.

8. The design structure according to claim 7, said metal silicide material comprising any one of nickel silicide, cobalt silicide and titanium silicide.

9. The design structure according to claim 7, further comprising an epitaxial silicon layer on said top surface and said opposing sidewalls of each of said semiconductor fins at said first end region such that said epitaxial silicon layer is positioned between said semiconductor fins and said conductive material.

10. The design structure according to claim 9, said design structure comprising a netlist which describes a circuit.

11. The design structure according to claim 7, said design structure residing on a storage medium as a data format used for the exchange of layout data of integrated circuits.

12. The design structure according to claim 7, said design structure including at least one of test data files, characterization data, verification data, and design specifications.

13. A design structure embodied in a machine readable medium used in a design process, the design structure comprising a field effect transistor comprising:

a substrate;

a plurality of semiconductor fins on said substrate, each of said semiconductor fins having a top surface, sidewalls, a first end region, a second end region and a center region positioned laterally between said first end region and said second end region, said first end region and said second end region comprising source/drain regions and said center region comprising a channel region;

a gate electrode on said top surface and said sidewalls of each of said semiconductor fins at said center region;

gate sidewall spacers on said top surface and said sidewalls of each of said semiconductor fins immediately adjacent to opposite sides said gate electrode;

a first conductor comprising a metal silicide material on said top surface and said sidewalls of each of said semiconductor fins at said first end region immediately adjacent to one of said gate sidewall spacers such that said metal silicide material fills at least a first upper portion of a first space extending between adjacent first end regions of adjacent semiconductor fins so as to electrically connect said adjacent first end regions; and a second conductor comprising said metal silicide material on said top surface and said sidewalls of each of said semiconductor fins at said second end region immediately adjacent to another one of said gate sidewall spacers such that said metal silicide material fill at least a second upper portion of a second space extending between adjacent second end regions of adjacent semiconductor fins so as to electrically connect said adjacent second end regions, said gate sidewall spacers electrically isolating said first conductor and said second conductor from said gate electrode.

14. The design structure according to claim 13, said metal silicide material comprising any one of nickel silicide, cobalt silicide and titanium silicide.

15. The design structure according to claim 13, comprising an epitaxial silicon layer on said top surface and said opposing sidewalls of each of said semiconductor fins such that said epitaxial silicon layer is positioned between said semiconductor fins and said conductive material.

16. The design structure according to claim 13, said plurality of semiconductor fins comprising at least two semiconductor fins.

17. The design structure according to claim 13, said semiconductor fins being approximately parallel.

18. The design structure according to claim 13, said design structure comprising a netlist which describes a circuit.

19. The design structure according to claim 13, said design structure residing on a storage medium as a data format used for the exchange of layout data of integrated circuits.

20. The design structure according to claim 13, said design structure including at least one of test data files, characterization data, verification data, and design specifications.

* * * * *